United States Patent
Colinge et al.

(10) Patent No.: US 9,478,624 B2
(45) Date of Patent: Oct. 25, 2016

(54) SELF-ALIGNED WRAPPED-AROUND STRUCTURE

(71) Applicant: Taiwan Semiconductor Manufacturing Company, Ltd., Hsin-Chu (TW)

(72) Inventors: Jean-Pierre Colinge, Hsin-Chu (TW); Kuo-Cheng Ching, Zhubei (TW); Ta-Pen Guo, Cupertino, CA (US); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/961,691

(22) Filed: Dec. 7, 2015

(65) Prior Publication Data

US 2016/0087054 A1   Mar. 24, 2016

Related U.S. Application Data

(62) Division of application No. 13/782,528, filed on May 10, 2013, now Pat. No. 9,209,247.

(51) Int. Cl.
| | |
|---|---|
| *H01L 27/108* | (2006.01) |
| *H01L 29/94* | (2006.01) |
| *H01L 29/423* | (2006.01) |
| *H01L 29/66* | (2006.01) |
| *H01L 29/775* | (2006.01) |

(Continued)

(52) U.S. Cl.
CPC ....... *H01L 29/4238* (2013.01); *H01L 29/0676* (2013.01); *H01L 29/42376* (2013.01); *H01L 29/66439* (2013.01); *H01L 29/775* (2013.01); *H01L 29/7827* (2013.01); *H01L 29/66469* (2013.01)

(58) Field of Classification Search
USPC ........ 257/302, 315, 329, 367, 288; 438/268, 438/269, 585
See application file for complete search history.

(56) References Cited

U.S. PATENT DOCUMENTS

| | | |
|---|---|---|
| 7,667,271 B2 | 2/2010 | Yu et al. |
| 7,759,729 B2 | 7/2010 | Bjoerk et al. |
| 8,076,231 B2 | 12/2011 | Saitoh et al. |

(Continued)

FOREIGN PATENT DOCUMENTS

| | | |
|---|---|---|
| JP | 2009239167 | 10/2009 |
| KR | 20060012724 | 2/2006 |

OTHER PUBLICATIONS

Cea S.M et al., "Process Modeling for Advanced Device Technologies," J. Comput. Electron, vol. 13, Issue 1, pp. 18-32, Aug. 6, 2013.

(Continued)

*Primary Examiner* — Errol Fernandes
(74) *Attorney, Agent, or Firm* — Slater Matsil, LLP

(57) ABSTRACT

An vertical gate-all-around transistor and method of making is provided. The vertical gate-all-around transistor includes a first semiconductor structure extending above a substrate, and a gate structure extending completely around the first semiconductor structure in a plan view. An outermost perimeter of the gate structure comprises a first protruding arcuate section interposed between linear sections, the first protruding arcuate section aligned with the first semiconductor structure.

20 Claims, 18 Drawing Sheets

(51) Int. Cl.
H01L 29/06 (2006.01)
H01L 29/78 (2006.01)

(56) References Cited

U.S. PATENT DOCUMENTS

| | | | |
|---|---|---|---|
| 8,164,146 | B2 | 4/2012 | Lung |
| 8,362,575 | B2 | 1/2013 | Kwok et al. |
| 8,367,498 | B2 | 2/2013 | Chang et al. |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,772,771 | B2 | 7/2014 | Tanaka |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 2005/0255667 | A1 | 11/2005 | Arghavani et al. |
| 2008/0197418 | A1* | 8/2008 | Parthasarathy ..... H01L 29/0696 257/367 |
| 2009/0215277 | A1 | 8/2009 | Lee et al. |
| 2009/0242990 | A1 | 10/2009 | Saitoh et al. |
| 2010/0210096 | A1* | 8/2010 | Masuoka .......... H01L 21/82388 438/585 |
| 2011/0068407 | A1 | 3/2011 | Yeh et al. |
| 2011/0303985 | A1 | 12/2011 | Masuoka et al. |
| 2012/0061838 | A1 | 3/2012 | Edelstein et al. |
| 2012/0223288 | A1 | 9/2012 | Kim et al. |
| 2013/0011983 | A1 | 1/2013 | Tsai et al. |
| 2014/0225184 | A1 | 8/2014 | Colinge et al. |
| 2014/0252412 | A1 | 9/2014 | Tsai et al. |

OTHER PUBLICATIONS

Antcliffe, G.A., et al., "Band Structure of Doped Bismuth Using the Shubnikov-de Haas Effect," Physics Review, vol. 160, No. 3, Aug. 15, 1967, pp. 531-537.
Li, C., et al., "Bismuth nano-droplets for group-V based molecular-beam droplet epitaxy," AIP Applied Physics Letters, Applied Physics Letters 99, (2011) pp. 243113-1-243113-3.
Cho, H.-J. et al., "Investigation of Gate Etch Damage at Metal/High-k Gate Dielectric Stack Through Random Telegraph Noise in Gate Edge Direct Tunneling Current," IEEE Electron Device Letters, vol. 32, No. 4, Apr. 2011, pp. 569-571.
Chu, M., et al., "Strain: A Solution for Higher Carrier Mobility in Nanoscale MOSFETs," Annual Reviews, vol. 39, 2009, pp. 203-229.
Dresselhaus, M.S., et al., "Carbon Nanotubes and Bismuth Nanowires," Chapter 3, Nanoengineering of Structural, Functional and Smart Materials, M.J. Schulz, A.D. Kelkar and M.J. Sundaresan Eds, CRC Press, Taylor and Francis Group (2005), 41 pages.
Ferain, I. et al., "Multigate transistors as the future of classicla metal-oxide-semiconductor field-effect transistors," Nature, vol. 479, Nov. 17, 2011, pp. 2-8.
Flachowsky, S., et al., "Understanding Strain-Induced Drive-Current Enhancement in Strained-Silicon n-MOSFET and p-MOSFET," IEEE Transactions on Electron Devices, vol. 57, No. 6, Jun. 2010, pp. 1343-1354.
Gandhi, R. et al., "Vertical Si-Nanowire n-Type Tunneling FETs With Low Subthreshold Swing (<50 mV/decade) at Room Temperature," IEEE Electron Device Letters, vol. 32, No. 4, Apr. 2011, pp. 437-439.
Hashemi, P., et al., "Gate-All-Around n-MOSFETs Wtih Uniaxial Tensile Strain-Induced Performance Enhancement Scalable to Sub-10-nm Nanowire Diameter," IEEE Device Letters, vol. 30, Issue 4, Apr. 2009, pp. 401-403.

Ionescu, A.M. et al., "Tunnel field-effect transistors as energy-efficient electronic switches," Review, doi: 10.1038/ nature10679, Nature, vol. 479 Nov. 17, 2011, pp. 329-337.
Kim, K., "Future Silicon Technology," 2012 Proceedings of the European Solid State Device Research Conference, pp. 1-6.
Kwong, D.-L. et al., "Vertical Silicon Nanowire Platform for Low Power Electronics and Clean Energy Applications," Hindawi Publishing Corporation, Jopurnal of Nanotechnology, vol. 2012, Article ID 492121, pp. 1-21.
Li, L., et al., "A route to fabricate single crystalline bismuth nanowire arrays with different diameters," Chemical Physics Letters 378 (2003), pp. 244-249.
Li, L., et al., "Synthetic control of large-area, ordered bismuth nanowire arrays," Science Direct, Materials Letters 59 (2005), pp. 1223-1226.
Larrieu, G. et al., "Vertical nanowire array-based field effect transistors for ultimate scaling," The Royal Society of Chemistry, Jan. 2013, pp. 2437-2441.
Lee, S., "Direct observation of the semimetal-to-semiconductor transition of individual single-crystal bismuth nanowires grown by on-film formation of nanowires," IOP Publishing, Nanotechnology 21 (2010) 405701, pp. 1-6.
Liang, J. et al., "Relaxtion of compressed eleastic islands on a viscous layer," Pergamon, www.actamat-journals.com, Acta Materialia 50 (2002) 2933-2944.
Limmer, S., "Recrystallized Arrays of Bismuth Nanowires with Trigonal Orientation," Nano Letters, 2014, vol. 14, pp. 1927-1931.
Lin, Y.-M., et al, "Transport properties of Bi nanowire arrays," Applied Physics Letters, vol. 76, No. 26, Jun. 26, 2000, pp. 3944-3946.
Maheshwaram, S., et al., "Device Circuit Co-Design Issues in Vertical Nanowire CMOS Platform," IEEE Electron Device Letters, vol. 33, Issue 7, Jul. 2012, pp. 934-936.
Niquet, Y.-M. et al., "Carrier Mobility in strained Ge nanowires," Journal of Applied Physics 112, , 084301 (2012), pp. 384301-1-084301-4.
Partin, D.L., et al., "Growth and characterization of epitaxial bismuth films," Physical Review B, vol. 38, No. 5, Aug. 15, 1988, pp. 3818-3825.
Peng, Y., et al., "Bismuth quantum-wires arrays fabricated by electrodeposition in nanoporous anodic aluminum oxide and its structural properties," Materials Science and Engineering B77 (2000), pp. 246-249.
Peterson, R.L. et al., "Comment on Fabrication of Strained Silicon on Insulator by Strain Transfer Process [Appl. Phys. Lett. 87, 051921 (2005)]," Appl. Phys. Lett. 88, 146101 (2006), 3 pages.
Schmidt, V. et al., "Realization of a Silicon Nanowire Vertical Surround-Gate Field-Effect Transistor," Small, vol. 2, Issue 1, Jan. 2006, pp. 85-88.
Shen, N. et al., "Vertical GAA Silicon Nanowire Transistor with Impact of Temperature on Device Parameters," World Academy of Science, Engineering and Technology, Issue 48, Dec. 2010, pp. 976-979.
Shim, W., et al., "Shubnikov-de Haas oscillations in an individual single-crystalline bismuth nanowire grown by on-film formation of nanowires," Applied Physics Letters 95, (2009), pp. 232107-1-232107-3.
Shim, W., et al., "On-Film Formation of Bi Nanowires with Extraordinary Electron Mobility," Nano Lett., 2009, 9 (1), pp. 18-22.
Sigma-Aldrich, "Bismuth", http://www.sigmaaldrich.com/materials-science/material-science-products.html? TablePage=19927132, 1 page.
Sun, Y. et al., "Junctionless Vertical-Si-Nanowire-Channel-Based SONOS Memory With 2-Bit Storage per Cell," IEEE Electron Device Letters, vol. 32, Issue 6, Jun. 2011, pp. 725-727.
Thelander, C. et al., "Nanowire-based one-dimensional electronics," Materials Today, vol. 9, Issue 10, Oct. 2006, pp. 28-35.
Tomioka, K. et al., "A III-V nanowire channel on silicon for high-performance vertical transistors," Nature, vol. 488, Aug. 9, 2012, 14 pages.

(56) References Cited

OTHER PUBLICATIONS

Tsai, R-W., et al., "Voltammetric study and electrodeposition of tellurium, lead, and lead telluride in room-temperature ionic liquid 1-ethyl-3-methylimidazolium tetrafluoroborate," Electrochimica Acta 137 (2014) pp. 49-56.

van Hulst, J.A., et al., "Epitaxial growth of bismuth films and bismuth-antimony heterostructures," Physical Review B, vol. 52, No. 8, Aug. 15, 1995-II, pp. 5953-5964.

Vandooren, A., et al., "Impact of process and geometrical parameters on the electrical characteristics of vertical nanwire silicon n-TFETs," Solid-State Electronics 72 (2012) pp. 82-87.

Wikipedia, "Strain engineering," http://en.wikipedia.org/wiki/Strain_engineering, downloaded Jul. 5, 2013, 2 pages.

Windbacher, T., "2.2.2 Local Strain," http://www.iue.tuwien.ac.at/phd/windbacher/node19.html, downloaded Jul. 5, 2013, 4 pages.

Yin, H., "Strain Relaxation of SiGe on Compliant BPSG and Its Applications," Dissertaion Presented to the Faculty of Princeton University in Candidacy for the Degree of Doctor of Philosophy, Nov. 2004, 6 pages.

Yin, H. et al., "Strain relaxation of SiGe islands on compliant oxide," Journal of Applied Physics, vol. 91, No. 12, Jun. 15, 2002, pp. 9716-9722.

Zhou, L., et al., "Nucleation and Growth of Bismuth Electrodeposition from Alkaline Electrolyte," Nucleation and Growth of Bismuth Electrodeposition, Bull. Korean Chem. Soc. 2012, vol. 33, No. 5, pp. 1541-1546.

Pham-Nguyen, et al., "Mobility enhancement by CESL strain in short-channel ultrathin SOI MOSFETs," Solid-State Electronics 54, www.elesevier.com/locate/sse, pp. 123-130, Dec. 2009.

Zhu, Yong et al., "Mechanical Properties of Vapor-Liquid-Solid Synthesized Silicon Nanowires," Nano Letters, vol. 9, No. 11, pp. 3934-3939, Jul. 2009.

\* cited by examiner

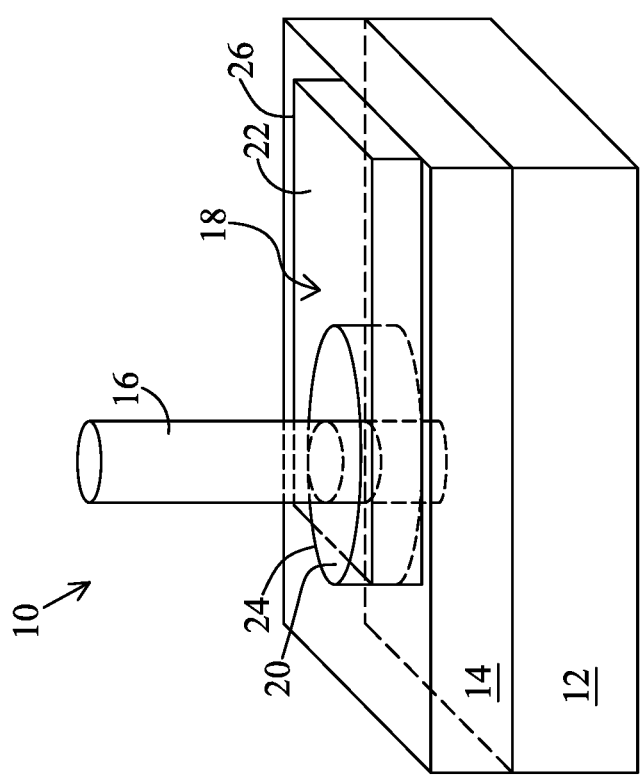

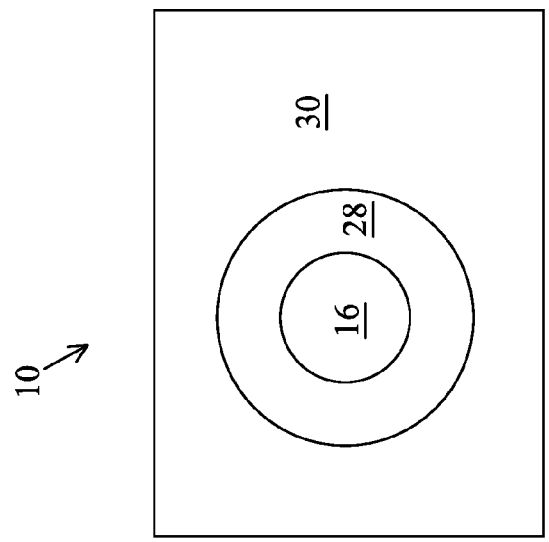
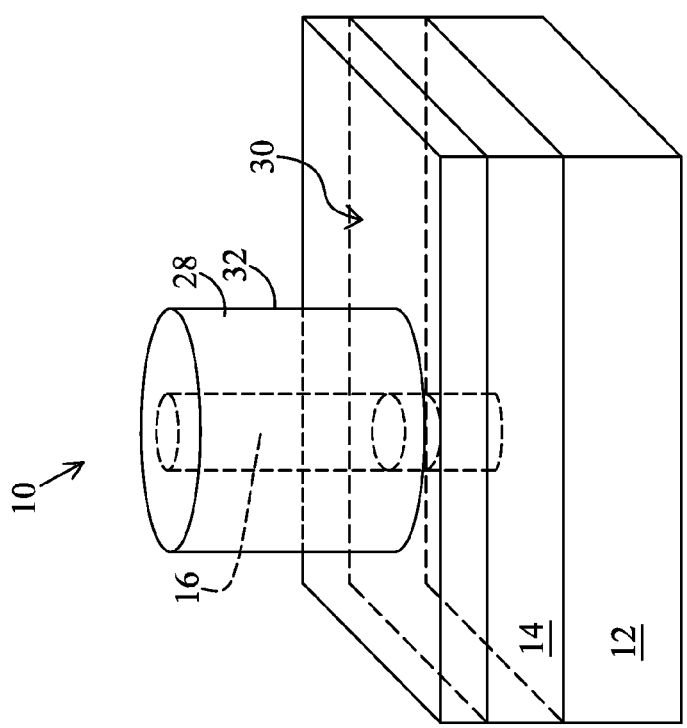
Fig. 2B
Fig. 2A

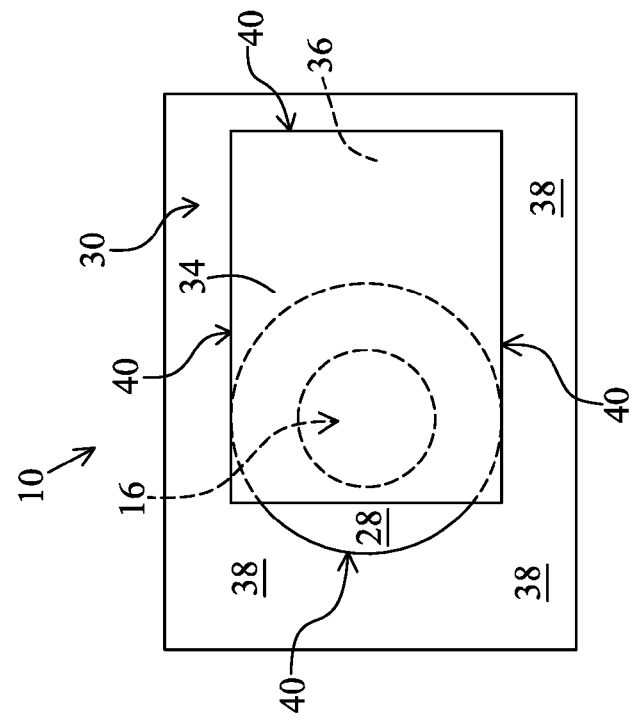
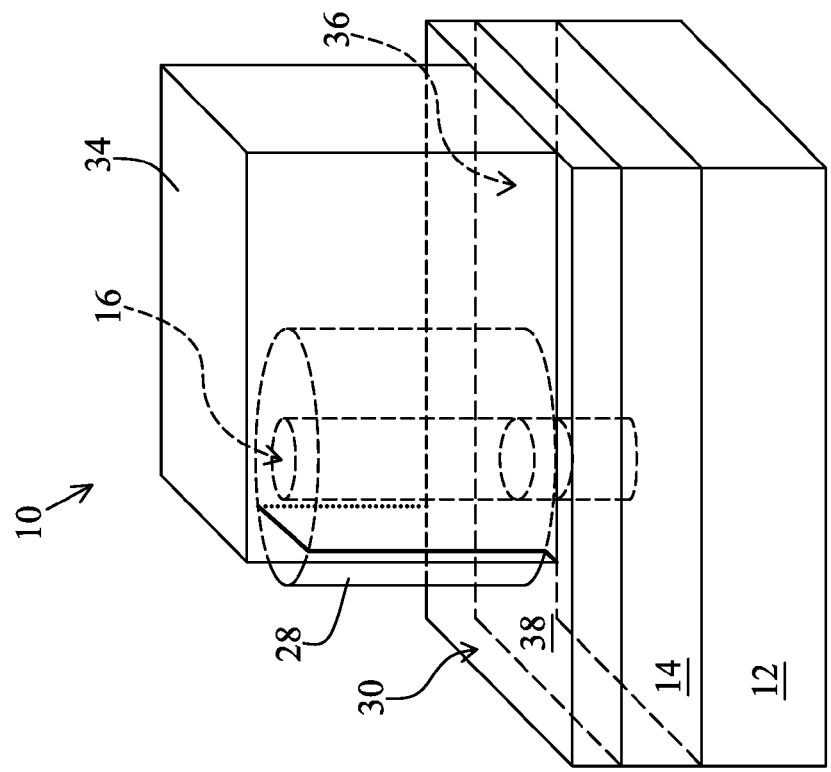
Fig. 3A
Fig. 3B

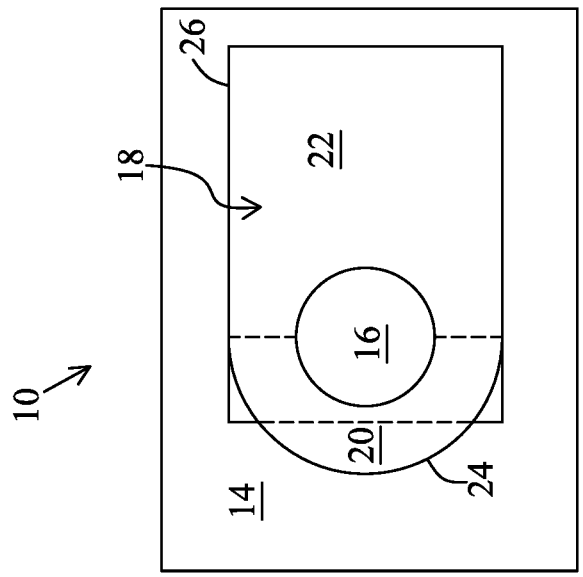
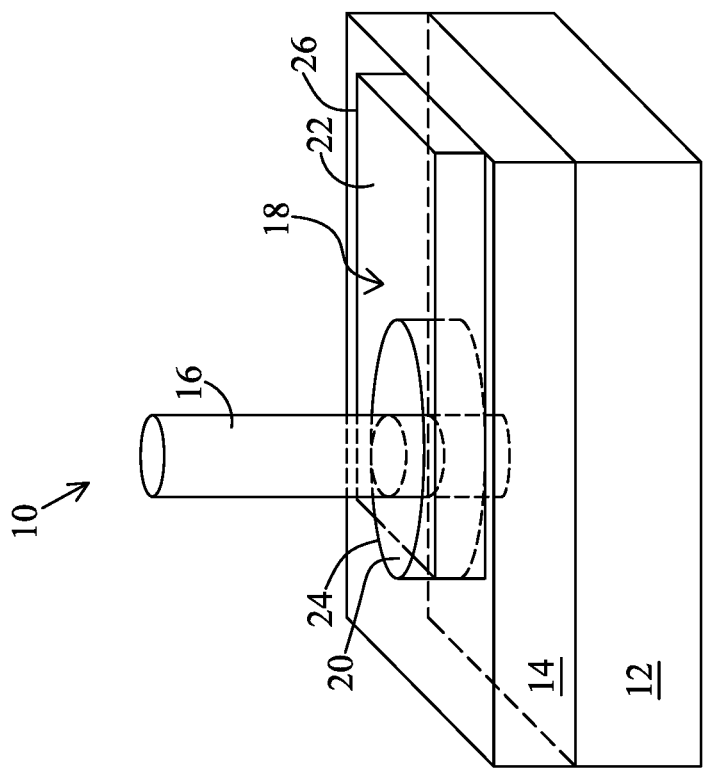
Fig. 5B
Fig. 5A

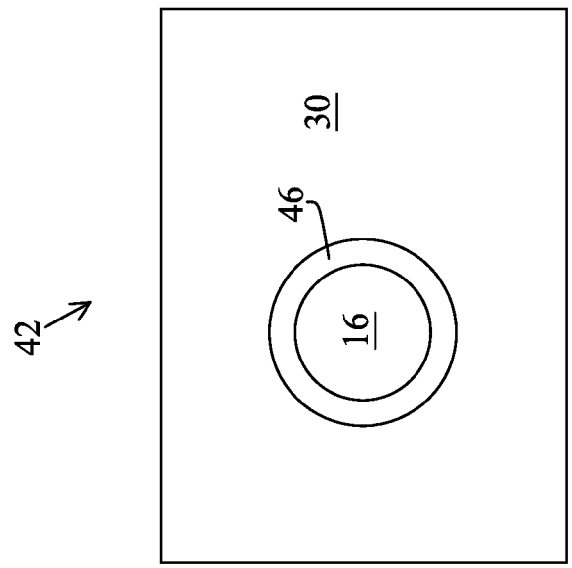
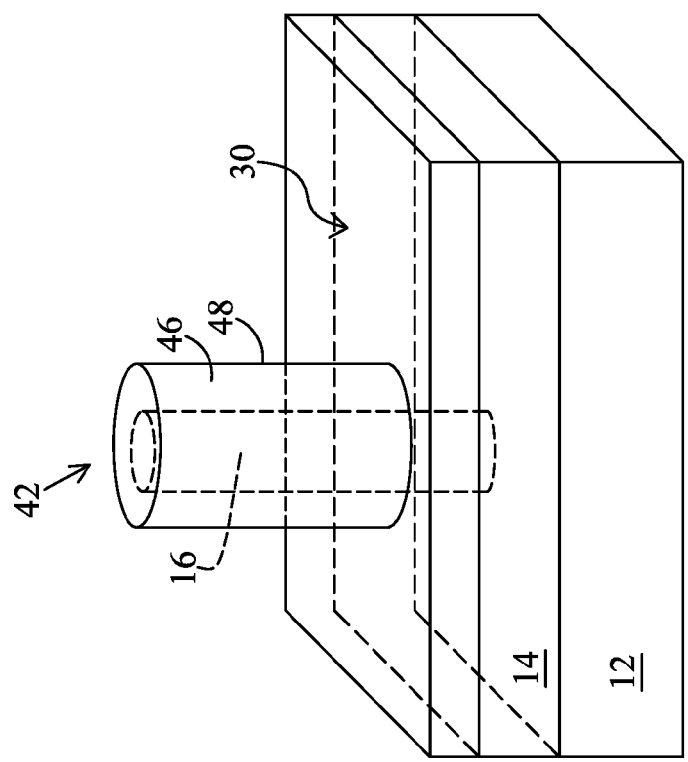
Fig. 7A
Fig. 7B

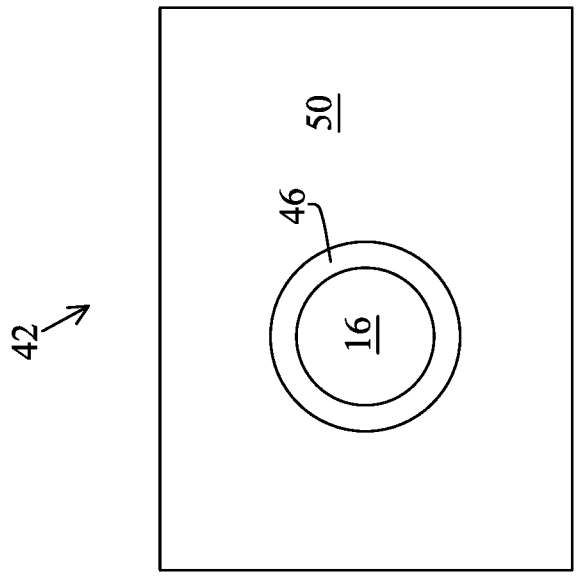
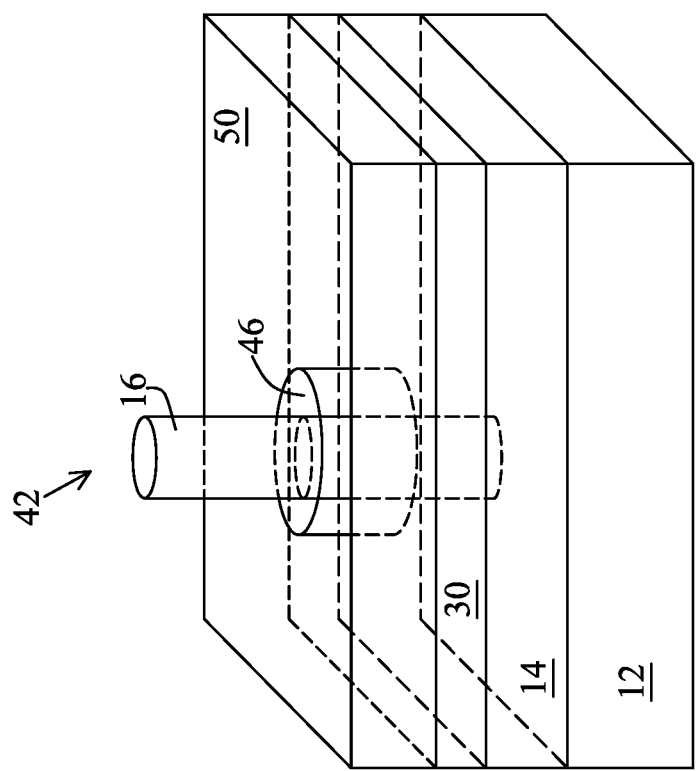

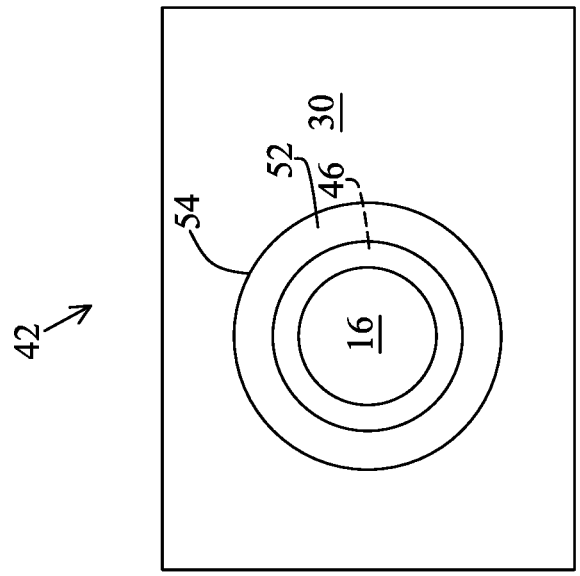
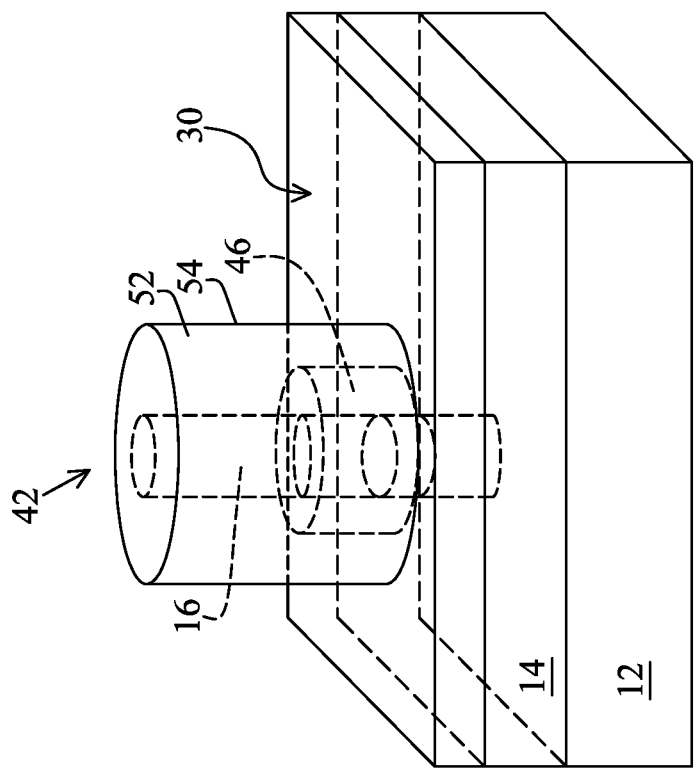
Fig. 9B
Fig. 9A

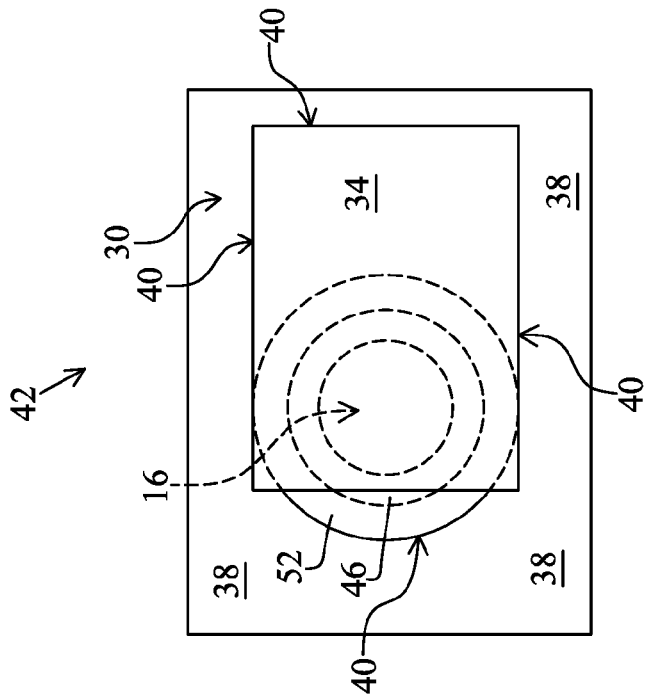
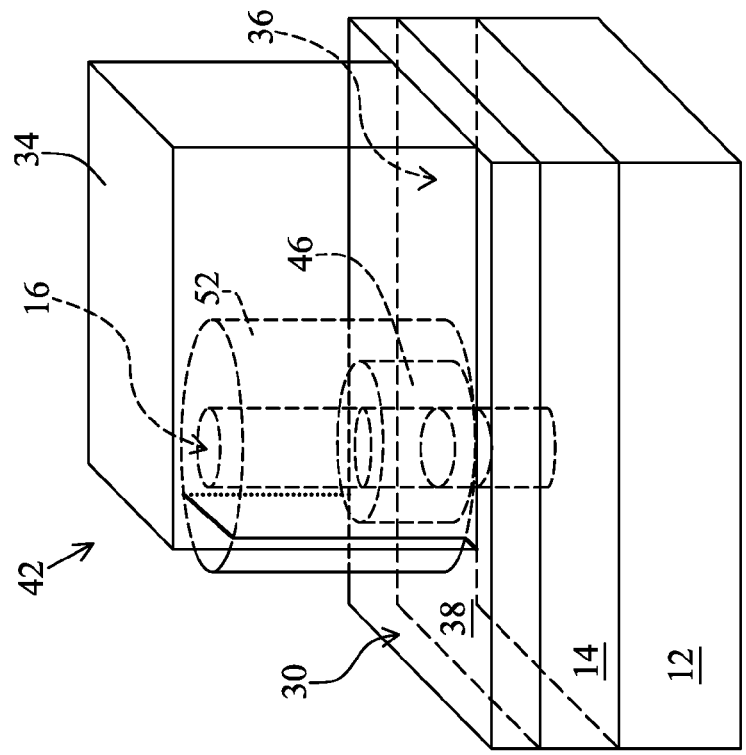
Fig. 10A
Fig. 10B

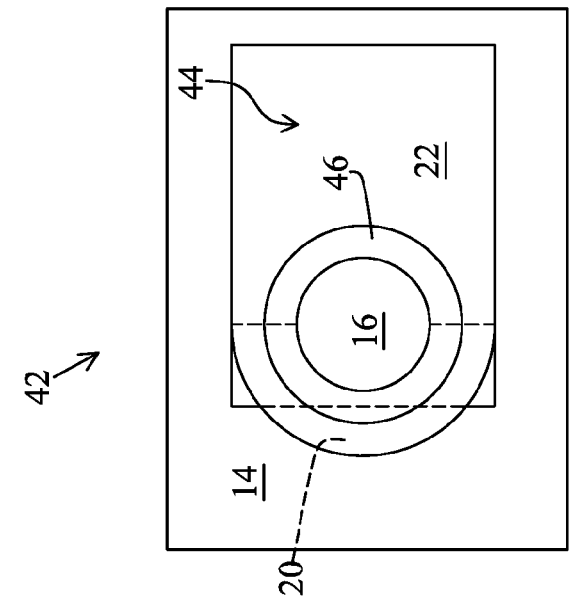
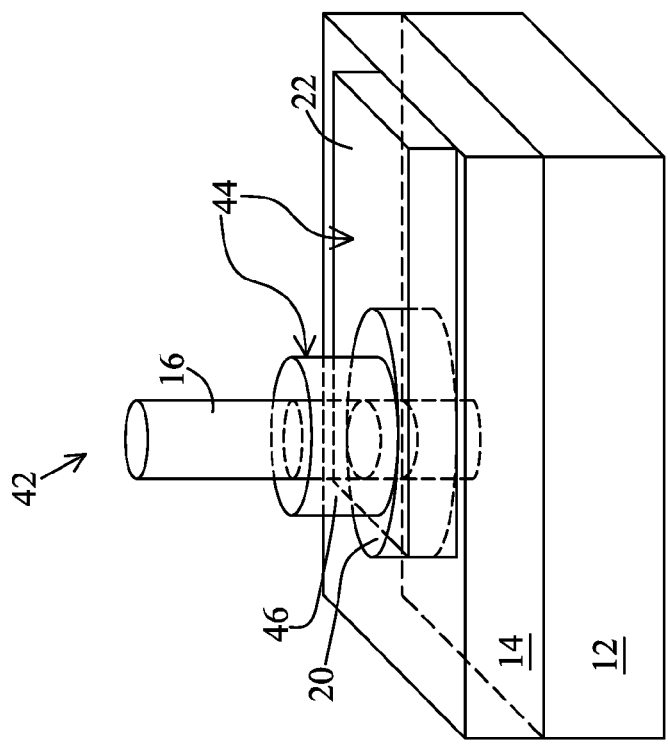
Fig. 12B
Fig. 12A

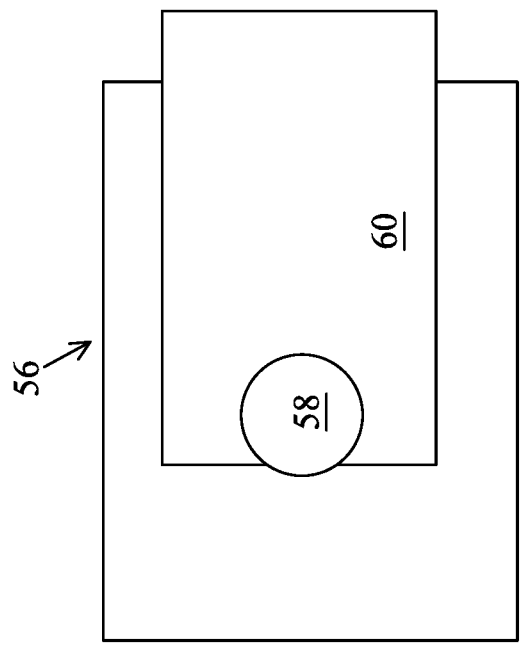
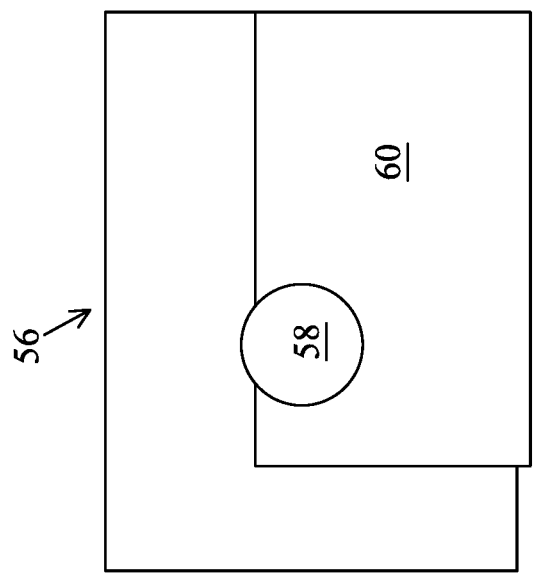
Fig. 13
Fig. 14 sure, and the advantages thereof, reference is now made to
SELF-ALIGNED WRAPPED-AROUND STRUCTURE This application is a divisional application of U.S. patent application Ser. No. 13/782,528, entitled "Self-Aligned Wrapped-Around Structure," filed on May 10, 2013, which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, gate-all-around FETs were developed. The gate-all-around FETs are similar in concept to FETs except that the gate material surrounds the channel region on all sides.

In a vertical gate-all-around (VGAA) transistor, the gate must be wrapped around the entire circumference or perimeter of a vertical semiconductor column (e.g., a nanowire). Because the gate electrode is produced by depositing a metal (and a thin gate dielectric) and etching the excess metal using lithography, the gate pattern must fully surround the nanowire. This imposes constraints on gate lithography, in particular to the alignment of the gate mask level to the nanowire level. The constraints limit the integration density and constitute a potential yield hazard.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 1 illustrates an embodiment vertical gate-all-around transistor;

FIGS. 2A-2B to FIGS. 5A-5B illustrate a cross section and a top view of a process of forming the embodiment vertical gate-all-around transistor of FIG. 1;

FIGS. 7A-7B to FIGS. 12A-12B illustrate a perspective view and a top view of a process of forming the embodiment vertical gate-all-around transistor of FIG. 1;

FIGS. 13-14 illustrate a conventional vertical gate-all-around transistor that is defective due to gate misalignment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 4B:
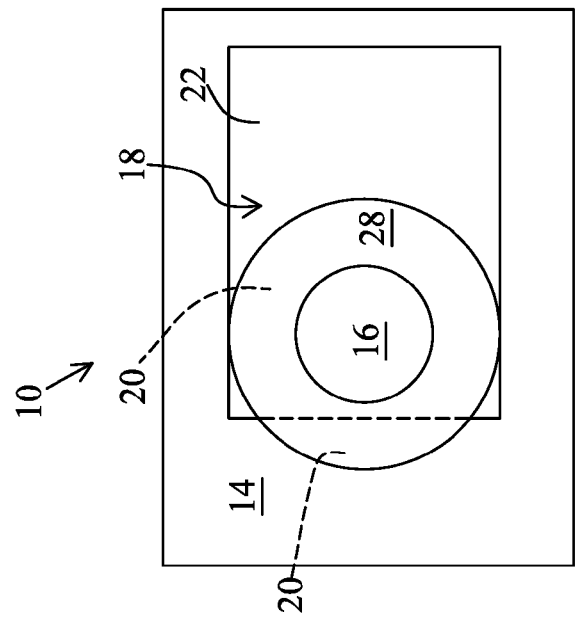

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a vertical gate-all-around (VGAA) transistor. Even so, the inventive concepts disclosed herein are not limited to the formation of a self-aligning gate. Indeed, other self-aligning structures other than a gate may also be formed using the inventive concepts disclosed herein. In addition, even though the disclosure is directed toward embodiment VGAA transistors, the inventive concepts disclosed herein may be applied to other types of integrated circuits, electronic structures, and the like.

Referring now to FIG. 1, an embodiment vertical gate-all-around (VGAA) transistor 10 is illustrated. As shown, the VGAA transistor 10 includes a substrate 12 supporting an oxide layer 14. In an embodiment, the substrate 12 is formed from silicon, bulk silicon, or a semiconductor material. In an embodiment, the oxide layer 14 is an oxide such as silicon dioxide ($SiO_2$). Other dielectric materials can be used for oxide layer 14, such as oxinitrides or nitrides.

A semiconductor column 16 projects away from the oxide layer 14. In an embodiment, the semiconductor column 16 is a nanowire formed from silicon. In an embodiment, the semiconductor column 26 is made of other semiconductor materials such as silicon germanium (SiGe), silicon carbide (SiC), Silicon carbon germanium (SiCGe), germanium (Ge), III-V compounds, or other semiconductor materials. The semiconductor material can be either monocrystalline, polycrystalline or amorphous. As shown in FIG. 1, the semiconductor column 16 is vertically-oriented relative to the horizontally-oriented oxide layer 14. However, other configurations and orientations are contemplated herein. The cross section of the semiconductor column presented in FIG. 1 is circular, but other section shapes can be used (e.g., square, hexagonal, rectangular, ellipsoidal, triangular, or shapes with sharp or rounded corners).

Still referring to FIG. 1, a gate 18 is formed over the oxide layer 14. In an embodiment, the gate 18 may be something other than a gate and formed from non-metal materials. The gate 18 generally includes a footer portion 20 (a.k.a., spacer-defined portion) and a non-footer portion 22 (a.k.a., gate mask-defined portion). In an embodiment, the footer portion 20 has a ring-like shape with an arcuate periphery 24. In an embodiment, the non-footer portion 22 has a rectangular, square, hexagonal, ellipsoidal, triangular, or other shape with sharp or rounded corners with a corresponding periphery 26. Even so, the gate 18 may be formed in any of a number of suitable configurations.

As will be more fully explained below, the footer portion 20 and the non-footer portion 22 of the gate 18 collectively ensure that the semiconductor column 16 is encircled or surrounded, even if the non-footer portion 22 of the gate 18 is not ideally located relative to the semiconductor column 16 during fabrication of the VGAA transistor 10 due to the inadvertent misalignment of, for example, a gate mask.

Referring collectively to FIGS. 2A-2B through FIGS. 5A-5B, a process flow for fabricating the VGAA transistor 10 of FIG. 1 is illustrated. As shown in perspective and top views of FIGS. 2A-2B, respectively, a spacer 28 is formed around a portion of the semiconductor column 16 projecting from a gate layer 30. As such, the spacer 28 covers and protects the underlying the gate layer 30. In an embodiment, the spacer 28 is a hard mask spacer having an arcuate periphery 32. In other words, the spacer 28 may be formed in the shape of a ring. In an embodiment, the gate layer 30 is a metal gate layer and includes a thin gate dielectric (not shown).

Referring now to FIGS. 3A-3B, a photolithography process is initiated to form a photoresist 34. As shown, the photoresist 34 is formed over a protected portion 36 of the gate layer 30 and a portion of the spacer 28. In other words, the photoresist 32 covers and protects portions of the underlying the gate layer 30 not already protected by the spacer 28.

Figure 4A:
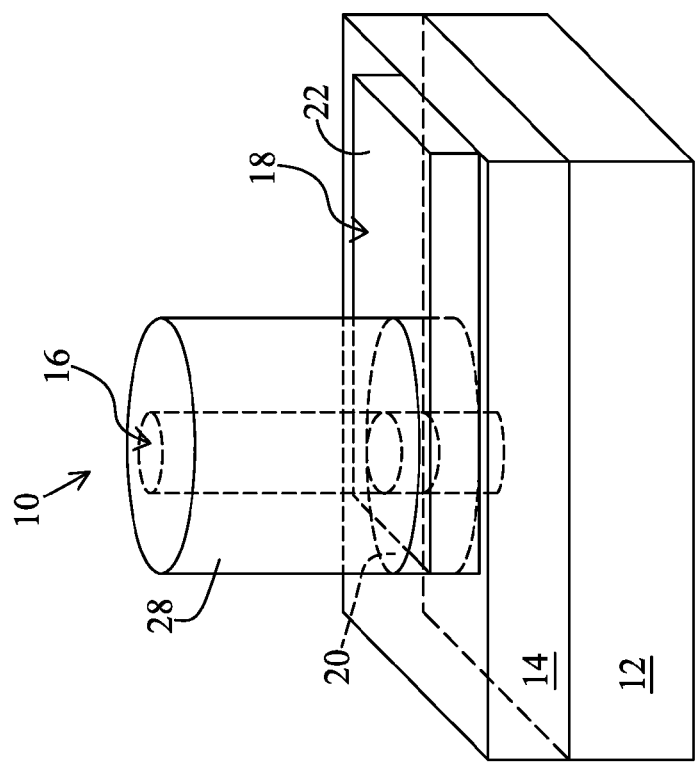

Referring now to FIGS. 3A-3B and 4A-4B, an unprotected portion 38 of the gate layer 30, which is disposed outside a periphery 40 collectively defined by the spacer 28 and the photoresist 32, is etched away. In an embodiment, the unprotected portion 38 is etched away using a dry etching process or another suitable etching process. By etching away the unprotected portion 38 of the gate layer 30, the gate 18 having the footer portion 20 and a non-footer portion 22 is formed as shown in FIGS. 4A-4B.

The footer portion 20 generally corresponds in size and shape to the spacer 28 and the non-footer portion 22 generally corresponds in size and shape to the photoresist 34. As will be more fully explained below, the footer portion 20 and the non-footer portion 22 of the gate 18 collectively encircle the semiconductor column 16, even if a mask used to form the gate 18 is inadvertently misaligned.

Still referring to FIGS. 3A-3B and 4A-4B, after the unprotected portion 38 of the gate layer 30 has been removed and the gate 18 defined, the photoresist 34 is removed. Thereafter, as shown in FIGS. 5A-5B, the spacer 28 is removed to form the embodiment VGAA transistor 10 of FIG. 1.

Figure 6:
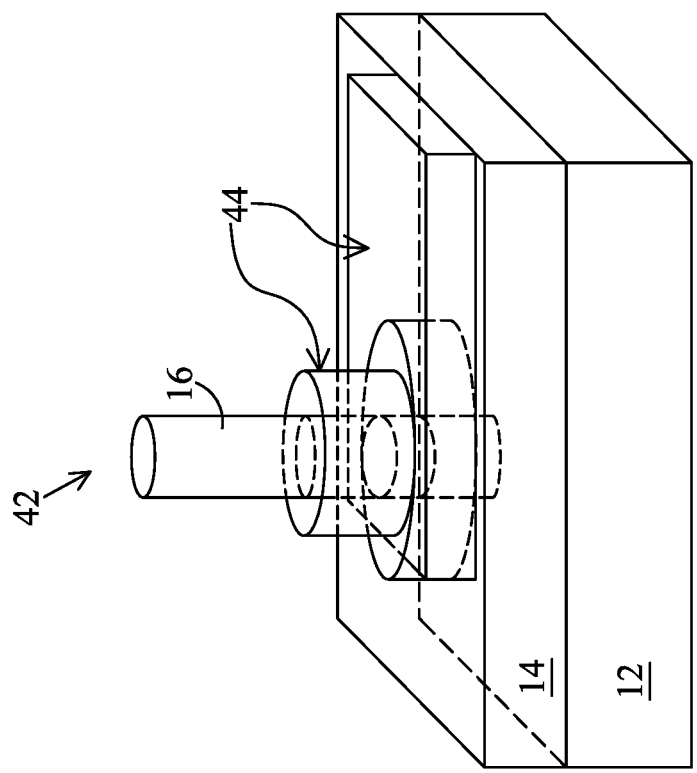
FIG. 6 illustrates an embodiment vertical gate-all-around transistor.

Referring now to FIG. 6, an embodiment vertical gate-all-around (VGAA) transistor 42 is illustrated. The embodiment VGAA transistor 42 of FIG. 6 is similar to the VGAA transistor 10 of FIG. 1. Indeed, the VGAA transistor 42 includes the substrate 12, the oxide layer 14, and the semiconductor column 16. However, a gate 44 of the embodiment VGAA transistor 42 of FIG. 6 is formed somewhat differently and has a different configuration than the gate 18 of the embodiment VGAA of FIG. 1.

Referring collectively to FIGS. 7A-7B through FIGS. 12A-12B, a process flow for fabricating the VGAA transistor 42 of FIG. 6 is illustrated. As shown in FIGS. 7A-7B, the gate layer 30 and the gate layer 46 are simultaneously formed over the oxide layer 14 and an initially exposed portion of the semiconductor column 16. In FIG. 7A, the gate layer 30 and the gate layer 46 are a deposited layer that covers both the insulator layer 40 and the semiconductor column 16. The portion of the deposited layer that covers the insulator 14 is referred to as the gate layer 30 and the portion of the deposited layer that covers the semiconductor column 16 is referred to as the gate layer 46. The gate layer 30 and the gate layer 46 are formed from a suitable gate material and collectively form the gate or the gate stack of the device.

In an embodiment, the gate layer 46 is a metal gate spacer having an arcuate periphery 48. In other words, the gate layer 46 may be formed in the shape of a ring. In an embodiment, the gate layer 30 is a metal gate layer. Because the gate layer 30 and the gate layer 46 are formed at the same time, they generally have a uniform thickness.

Referring now to FIGS. 8A-8B, an additional oxide layer 50 is deposited over the gate layer 30 and around the gate layer 46. Thereafter, chemical mechanical processing (CMP) is used to flatten the surface of the additional oxide layer 50 and an etchback process is used to recess both the additional oxide layer 50 and the gate layer 46 to give the gate layer 46 a desired height (which is equal to the thickness of the additional oxide layer 50 as recessed).

As shown in FIGS. 9A-9B, a spacer 52 is formed around a subsequently exposed portion of the semiconductor column 16. The spacer 52 covers and protects portions of the underlying the gate layer 30 and the gate layer 46. In an embodiment, the spacer 52 is a hard mask spacer having an arcuate periphery 54. In other words, the spacer 52 may be formed in the shape of a ring.

Referring now to FIGS. 10A-10B, a photolithography process is initiated to form the photoresist 34. As shown, the photoresist 34 is formed over the protected portion 36 of the gate layer 30 and a portion of the spacer 52. Therefore, the photoresist 34 covers and protects the underlying the gate layer 30 not already protected by the spacer 52.

Figure 11B:
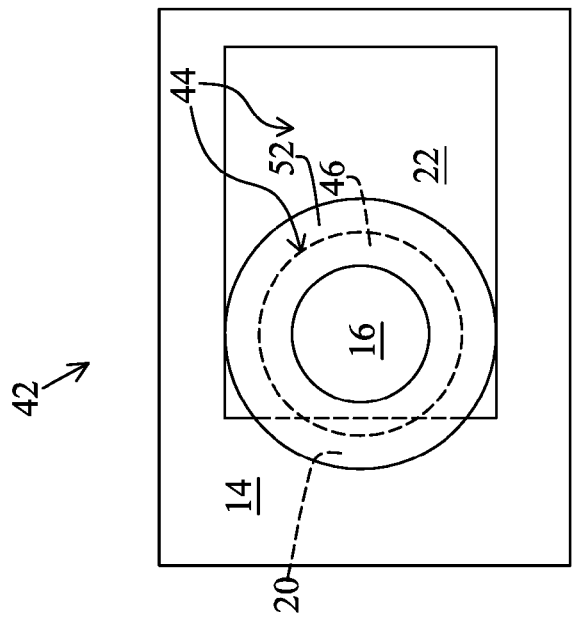
Figure 11A:
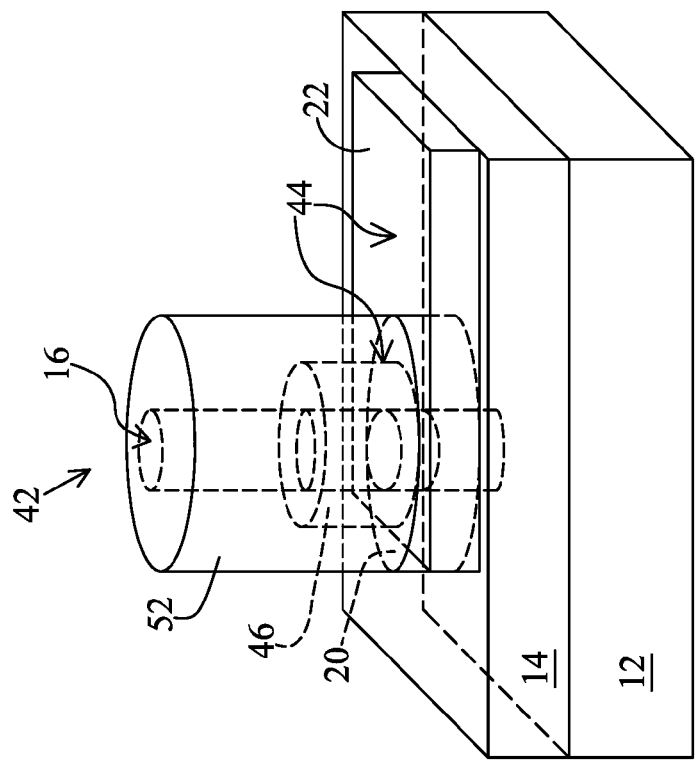

Referring now to FIGS. 10A-10B and 11A-11B, an unprotected portion 38 of the gate layer 30, which is disposed outside the periphery 40 collectively defined by the spacer 52 and the photoresist 34, is etched away. In an embodiment, the unprotected portion 38 is etched away using a dry etching process or another suitable etching process. By etching away the unprotected portion 38 of the gate layer 30, the footer portion 20 and the non-footer portion 22 are formed as shown in FIGS. 11A-11B.

We now refer to FIGS. 12A-12B. The footer portion 20 generally corresponds in size and shape to the spacer 52 and the non-footer portion 22 generally corresponds in size and shape to the photoresist 34. As will be more fully explained below, the footer portion 20 and the non-footer portion 22 collectively encircle the semiconductor column 16, even if a mask used to form the entire gate 44 is inadvertently misaligned.

Still referring to FIGS. 12A-12B, after the unprotected portion 38 of the gate layer 30 has been removed, the photoresist 34 and the spacer 52 are removed. With the photoresist 34 and the spacer 52 removed, the embodiment VGAA transistor 42 of FIG. 6 is formed. As shown, the gate 44 of the embodiment VGAA transistor 42 is collectively formed by the footer portion 20, the non-footer portion 22, and the lower portion of the gate layer 46. In an embodiment, the lower portion of the gate layer 46 shown in FIG. 12A may be used to control a gate length where the collective gate 44 is a metal gate.

Figure 16:
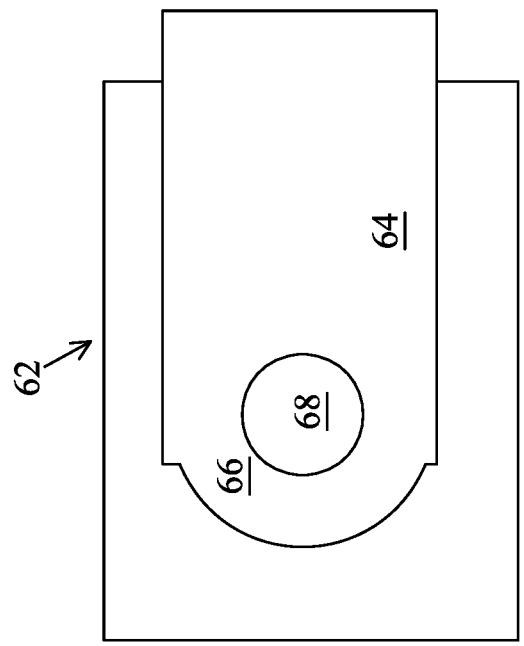
FIGS. 15-16 illustrate an embodiment vertical gate-all-around transistor that compensates for misalignment by using a footer.
Figure 15:
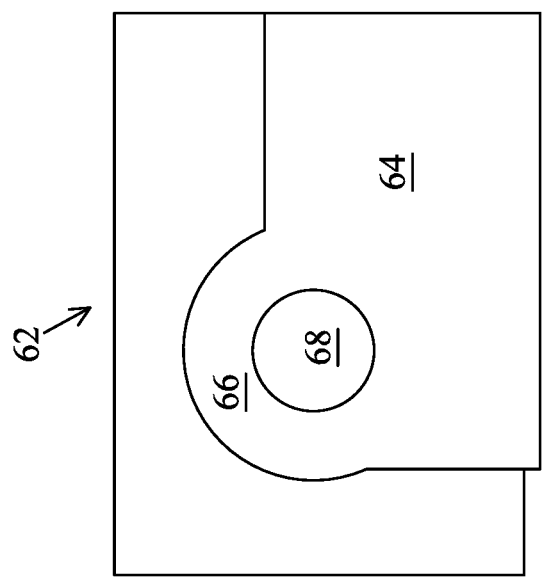

FIGS. 13-14 illustrate a conventional vertical gate-all-around transistor 56 that is defective due to misalignment. Indeed, the gate 58 does not completely surround the vertical nanowire 60. In contrast, FIGS. 15-16 illustrate an embodiment vertical gate-all-around transistor 62 that compensates for misalignment using a gate 64 with a footer 66. Indeed, because of the footer 66 the gate 64 (i.e., gate electrode) completely surrounds or encircles a nanowire 68. Therefore, in case of poor alignment (i.e., if the rectangular gate mask does not completely surround the vertical nanowire 68) the vertical semiconductor nanowire 68 is still fully surrounded by gate material.

Figure 17:
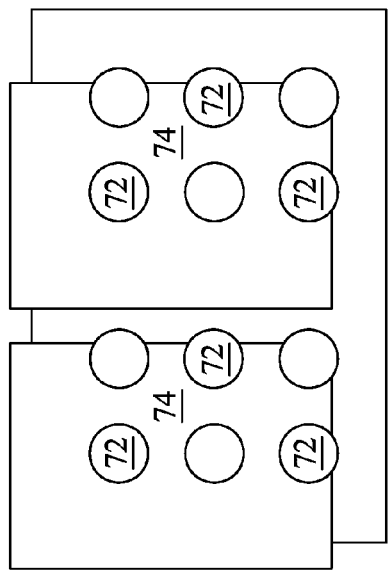
FIGS. 17-19 illustrate a tolerance needed for a conventional vertical gate-all-around transistor and a conventional vertical gate-all-around transistor that is defective due to misalignment.
Figure 18:
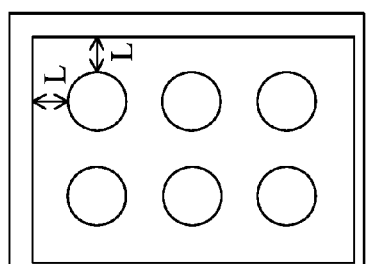
Figure 19:
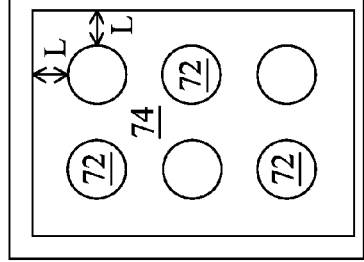
Figure 21:
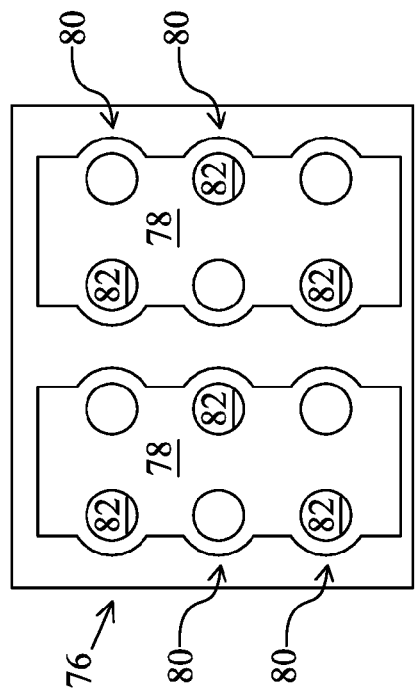
FIGS. 20-21 illustrate an embodiment vertical gate-all-around transistor that compensates for misalignment using a footer.
Figure 20:
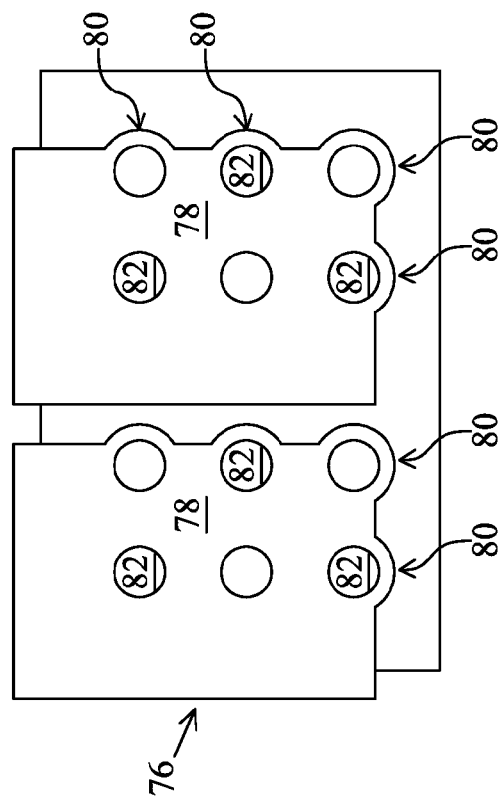

FIG. 17 illustrates a tolerance, L, needed for the gate mask of a conventional vertical gate-all-around transistor 70 with several nanowires 72 surrounded by a gate 74. FIGS. 18-19 illustrate the conventional vertical gate-all-around transistor 70, which is in a defective condition due to misalignment of the nanowires 72 relative to the gate 74. Indeed, the gate 74 does not completely surround each of the vertical nanowires 72. In contrast, FIGS. 20-21 illustrate an embodiment vertical gate-all-around transistor 76 that compensates for gate mask misalignment using a gate 78 with a footer 80. Indeed, the gate 78 (i.e., gate electrode) completely surrounds or encircles each of the nanowires 82 due, in part, to the footer 80. Therefore, a reduction of the gate mask width is now acceptable.

Figure 22:
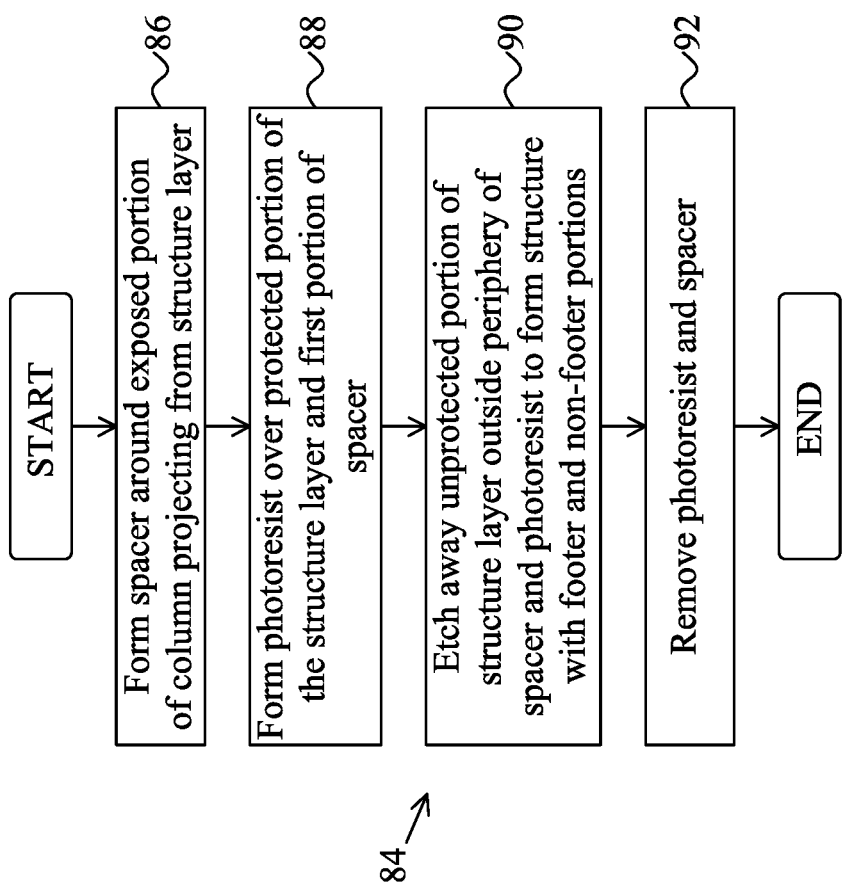
FIG. 22 is an embodiment method of making a self-aligned vertical gate-all-around device.

Referring now to FIG. 22, an embodiment method 84 of making a self-aligned vertical gate-all-around device is illustrated. In block 86, a spacer is formed around an exposed portion of a semiconductor column projecting from a gate layer. In block 88, a photoresist is formed over a protected portion of the gate layer and a first portion of the spacer. In block 90, an unprotected portion of the gate layer disposed outside a periphery collectively defined by the spacer and the photoresist is etched away to form a gate having a footer portion and a non-footer portion. The non-footer portion and the footer portion collectively encircle the semiconductor column. In block 92, the photoresist and the spacer are removed.

Figure 23:
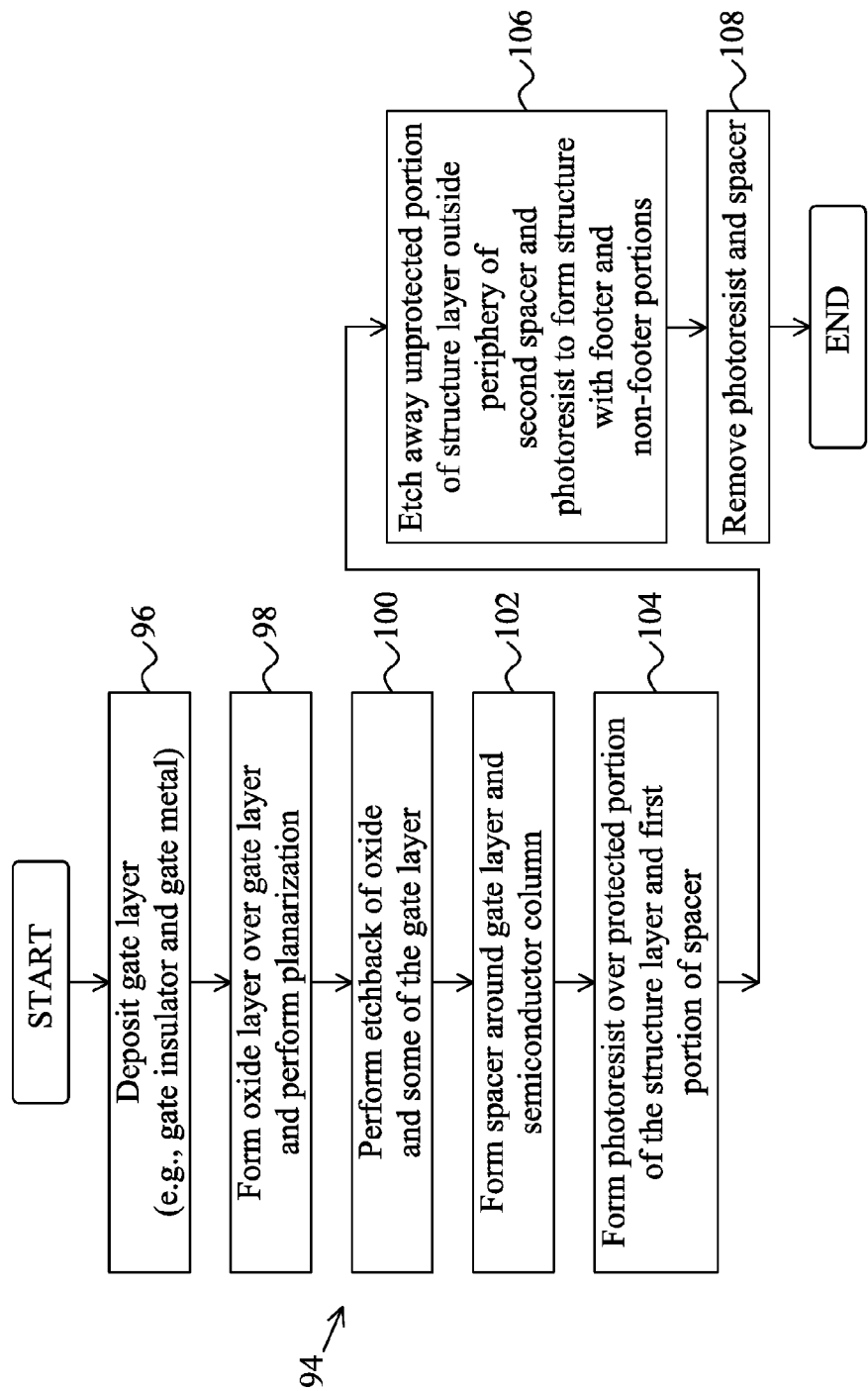
FIG. 23 is an embodiment method of making a self-aligned vertical gate-all-around device.

Referring now to FIG. 23, an embodiment method 94 of making a self-aligned vertical structure-all-around device is illustrated. In block 96, a gate layer is deposited around an initial exposed portion of a semiconductor column and over an initial oxide layer. In block 98, an additional oxide layer is formed over the gate layer and then planarized. In block 100, an etchback process is performed to recess the additional oxide layer and a portion of the gate layer wrapped around the initially exposed portion of the semiconductor column. In block 102, a spacer is formed around the gate layer remaining around the initially exposed portion of the semiconductor column and a subsequently exposed portion of the semiconductor column.

In block 104, a photoresist is formed over a protected portion of the gate layer and a first portion of the spacer. In block 106, an unprotected portion of the gate layer disposed outside a periphery collectively defined by the spacer 28 and the photoresist is etched away to form a gate having a footer portion and a non-footer portion. The non-footer portion and the footer portion collectively encircle the semiconductor column and the portion of the gate 46 that is wrapped around the column. In block 108, the photoresist 34 and the spacer 28 are removed.

From the foregoing, it should be recognized that a self-aligned vertical wrapped-around gate may be fabricated using the concepts disclosed herein. Because the gate (e.g., the printed gate) has and employs a footer (e.g., a gate footer), the gate is self-aligning and ensures that, for example, a vertical nanowire is entirely surrounded. By way of example, a gate that is formed using the concepts disclosed herein is the result of a "logical OR" function or additive combination of the gate mask and the footprint of the spacer. This allows for automatic self-alignment of the gate and improved tolerance to misalignment of the printed gate level. As such, the design rules with regard to gate alignment can be relaxed, which increases or improves packing density.

In addition, the tolerance alignment of the gate to the active area (nanowire) is improved. The dimensions (width and pitch) of the gate level can be tightened. Both improved alignment tolerances and dimensions tightening improve integration density.

An embodiment method of making a self-aligned vertical gate-all-around device includes forming a spacer around an exposed portion of a semiconductor column projecting from a gate layer, forming a photoresist over a protected portion of the gate layer and a first portion of the spacer, etching away an unprotected portion of the gate layer disposed outside a periphery collectively defined by the spacer and the photoresist to form a gate having a footer portion and a non-footer portion, the non-footer portion and the footer portion collectively encircling the semiconductor column, and removing the photoresist and the spacer.

An embodiment method of making a self-aligned vertical gate-all-around device includes depositing a gate layer around an initial exposed portion of a semiconductor column and over an initial oxide layer, forming an additional oxide layer over the gate layer and planarizing the additional oxide layer, performing an etchback process to recess the additional oxide layer and a portion of the gate layer wrapped around the initially exposed portion of the semiconductor column, forming a spacer around the gate layer remaining around the initially exposed portion of the semiconductor column and a subsequently exposed portion of the semiconductor column, forming a photoresist over a protected portion of the gate layer and a first portion of the spacer, etching away an unprotected portion of the gate layer disposed outside a periphery collectively defined by the spacer and the photoresist to form a gate having a footer portion and a non-footer portion, the footer portion and the non-footer portion collectively encircling the semiconductor column, and removing the photoresist and the second spacer.

An embodiment vertical gate-all-around transistor includes an oxide layer disposed over a semiconductor layer, a semiconductor column projecting from the oxide layer, and a gate disposed over the oxide layer, the gate having a footer portion and a non-footer portion collectively encircling the semiconductor column.

In another embodiment, a vertical gate-all-around transistor is provided, The vertical gate-all-around transistor includes a first semiconductor structure extending above a substrate, and a gate structure extending completely around the first semiconductor structure in a plan view, wherein an outermost perimeter of the gate structure comprises a first protruding arcuate section interposed between linear sections, the first protruding arcuate section aligned with the first semiconductor structure.

In yet another embodiment, a vertical gate-all-around transistor is provided. The vertical gate-all-around transistor includes a substrate, a dielectric layer over the substrate, and one or more semiconductor structures extending above the dielectric layer. A gate structure extends over the dielectric layer, wherein the one or more semiconductor structures extend through the gate structure such that the gate structure completely around a perimeter of the one or more semiconductor structures in a plan view, an outermost perimeter of the gate structure having linear sections connected with a first protruding arcuate section in a plan view, the first protruding arcuate section corresponding to a first semiconductor structure of the one or more semiconductor structures.

In yet still another embodiment, a vertical gate-all-around transistor is provided. The vertical gate-all-around transistor includes an oxide layer disposed over a semiconductor layer, a semiconductor column projecting from the oxide layer, and a gate disposed over the oxide layer, the gate having a footer portion and a non-footer portion collectively encircling the semiconductor column, the footer portion comprising a protruding arcuate section.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A vertical gate-all-around transistor comprising:
a first semiconductor structure extending above a substrate; and
a gate structure extending completely around the first semiconductor structure in a plan view, wherein an outermost perimeter of the gate structure comprises a first protruding arcuate section interposed between linear sections, the linear sections and the first protruding arcuate section having a same thickness in a direction normal to a major surface of the substrate, the first protruding arcuate section aligned with the first semiconductor structure.

2. The vertical gate-all-around transistor of claim 1, wherein the substrate comprises a semiconductor substrate and an overlying dielectric layer, the first semiconductor structure extending through the dielectric layer.

3. The vertical gate-all-around transistor of claim 1, wherein the gate structure has a planar upper surface.

4. The vertical gate-all-around transistor of claim 1, wherein the gate structure comprises a base portion and a raised portion on the base portion, the raised portion extending above the base portion along sidewalls of the first semiconductor structure, the raised portion have a width less than the base portion.

5. The vertical gate-all-around transistor of claim 1, further comprising:
a second semiconductor structure extending above the substrate, wherein the outermost perimeter of the gate structure further comprises a second protruding arcuate section aligned with the second semiconductor structure.

6. The vertical gate-all-around transistor of claim 1, further comprising:
a second semiconductor structure extending above the substrate, wherein the outermost perimeter of the gate structure is free of a protruding arcuate section aligned with the second semiconductor structure.

7. The vertical gate-all-around transistor of claim 1, wherein the gate structure comprises a metal gate electrode.

8. The vertical gate-all-around transistor of claim 1, wherein the first semiconductor structure comprises a nanowire.

9. A vertical gate-all-around transistor comprising:
a substrate;
a dielectric layer over the substrate;
one or more semiconductor structures extending above the dielectric layer; and
a gate structure over the dielectric layer, the one or more semiconductor structures extending through the gate structure such that the gate structure completely around a perimeter of the one or more semiconductor structures in a plan view, an outermost perimeter of the gate structure having co-linear sections connected with a first protruding arcuate section in a plan view, the first protruding arcuate section corresponding to a first semiconductor structure of the one or more semiconductor structures.

10. The vertical gate-all-around transistor of claim 9, wherein the one or more semiconductor structures comprises a plurality of semiconductor structures.

11. The vertical gate-all-around transistor of claim 10, further comprising a second protruding arcuate section corresponding to a second one of the plurality of semiconductor structures.

12. The vertical gate-all-around transistor of claim 9, wherein the linear sections are co-linear.

13. The vertical gate-all-around transistor of claim 9, wherein the linear sections extend in along different directions.

14. The vertical gate-all-around transistor of claim 9, wherein the gate structure comprises a raised portion over a base portion, the raised portion having a substantially uniform thickness around the first semiconductor structure in a plan view.

15. The vertical gate-all-around transistor of claim 9, wherein each of the one or more semiconductor structures extending through the gate structure has a corresponding protruding arcuate section.

16. A vertical gate-all-around transistor comprising:
an oxide layer disposed over a semiconductor layer;
a semiconductor column projecting from the oxide layer; and
a gate disposed over the oxide layer, the gate having a footer portion and a non-footer portion collectively encircling the semiconductor column, the footer portion comprising a protruding arcuate section, the non-footer portion extending further from the semiconductor layer than the footer portion, the footer portion completely surrounding the non-footer portion in a plan view.

17. The vertical gate-all-around transistor of claim 16, wherein the gate is a metal gate.

18. The vertical gate-all-around transistor of claim 16, wherein the oxide layer is a silicon dioxide.

19. The vertical gate-all-around transistor of claim 16, wherein the semiconductor column is a vertical column and the oxide layer is a horizontal layer.

20. The vertical gate-all-around transistor of claim 16, wherein the gate includes a spacer portion stacked on at least one of the footer portion and the non-footer portion, the spacer portion encircling the semiconductor column.

* * * * *